(12) United States Patent
Ryan

(10) Patent No.: US 6,327,216 B1
(45) Date of Patent: *Dec. 4, 2001

(54) FULL PAGE INCREMENT/DECREMENT BURST FOR DDR SDRAM/SGRAM

(75) Inventor: Kevin J. Ryan, Eagle, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/513,641

(22) Filed: Feb. 25, 2000

Related U.S. Application Data

(63) Continuation-in-part of application No. 09/259,034, filed on Feb. 26, 1999.

(51) Int. Cl.[7] ............................................. G11C 8/00
(52) U.S. Cl. ..................... 365/233; 365/236; 365/230.06
(58) Field of Search .................................. 365/233, 236, 365/230.02, 230.06

(56) References Cited

U.S. PATENT DOCUMENTS

| | | | |
|---|---|---|---|
| 5,644,788 | 7/1997 | Courtright et al. | 395/855 |
| 5,915,126 | 6/1999 | Maule et al. | 395/855 |
| 5,973,993 | 10/1999 | Morgan | 365/236 |
| 6,011,751 * | 1/2000 | Hirabayashi | 365/230.02 |

OTHER PUBLICATIONS

"16Mb Double Data Rate Synchronous Graphics RAM", *IBM Corporation*, IBM01616328RL6A, pp. 1–53, (Dec. 1997).

"16Mbit DDR SGRAM, 128K×32Bit×4 Banks Double Data Rate Synchronous Graphic RAM with Bi–directional Data Strobe, Revision 0.6", *Samsung Electronics*, KM432D5131, pp. 1–48, (Apr. 1998).

* cited by examiner

*Primary Examiner*—Vu A. Le
(74) *Attorney, Agent, or Firm*—Schwegman, Lungberg, Woessner & Kluth, P.A.

(57) ABSTRACT

A graphics subsystem having a dual-data rate (DDR) synchronous dynamic random access memory (SDRAM)/synchronous graphic random access memory (SGRAM), which has a full-page increment/decrement burst mode. In one embodiment, the DDR SDRAM/SGRAM includes a memory array and a logic circuitry coupled thereto. The graphics subsystem may be formed on a single semiconductor chip. The memory array is addressable by even and odd word addresses. The logic circuitry has a burst increment mode to access the array starting at an even word address and a burst decrement mode to access the array starting at an odd word address.

18 Claims, 6 Drawing Sheets

FULL PAGE INCREMENT/DECREMENT BURST FOR DDR SDRAM/SGRAM

This application is a CIP of Ser. No. 09/259,034 filed Feb. 26, 1999.

RELATED APPLICATIONS

This application is a continuation in part of a patent application filed.

FIELD OF THE INVENTION

This invention relates generally to dual-data rate (DDR) memories, and more particularly to full page increment/decrement burst for such memories.

BACKGROUND OF THE INVENTION

Graphics-intensive applications for computers such as personal computers (PC's) are becoming increasingly more popular. Such applications include high-end computer-aided drafting (CAD) applications, games, real-time video applications, as well as other applications. As these applications become more complex, they require the computers on which they are run to render and execute graphics much more quickly. Furthermore, as the typical resolution of computer screens have increased from 640×480 pixels (horizontal×vertical) to 800×600, 1024×768 and beyond, and increased color information per pixel from two bits to 24 bits to 32 bits and beyond, the processing demand placed on the computers for fast graphics execution has also grown.

The typical computer relies on a graphics subsystem (also known as a graphics card, video card, graphic accelerator card, or a display adapter, among other terms) to assist it in the display of graphics on a display device. A graphics card generally includes a specialized processor or processors that are tailor-made for graphics rendering, as well as an amount of memory, ranging from one, two, four, eight, sixteen megabytes and up, so that a complete screen of graphics information, known as a frame, can be stored by the graphics card. Thus, this memory is generally known as a frame buffer of the graphics card. Graphics "cards", may also be integrated within a single chip on a motherboard of a computer. A graphics card, and potentially other components, make up the graphics subsystem of a computer. The entirety of the graphics subsystem may also be integrated into a single chip on the motherboard of a computer. The graphic subsystem and other computer components from the motherboard may alternatively be embedded in a semiconductor chip.

Initially, the memory of a graphics card was standard-issue dynamic random-access memory (DRAM), of a sort also used by computer processors to hold more general information. Thus, as improvements in memory to increase their speed became available, such as the introduction of synchronous dynamic random-access memory (SDRAM), they usually have been utilized within graphics cards, too. Ultimately, however, the specialized needs of graphics rendering required their own type of memory, such as synchronous graphics random-access memory (SGRAM), which is analogous to SDRAM, but includes enhanced graphics features for use with graphics cards. The need for faster memory within graphics cards has not, however, abated.

Thus, graphics cards manufacturers have looked to new technologies, such as Rambus DRAM's (also known as Direct RDRAM's), available from Rambus, Inc. of Mountain View, Calif., to increase graphics subsystem performance. Rambus DRAM use within graphics cards, however, has been limited because it is based on a closed standard governed by Rambus, Inc., such that use of Rambus DRAM requires the payment of royalties to Rambus, Inc. Therefore, manufacturers have looked to other technologies that are based on open standards.

One such type of memory is the Double Data Rate (DDR) DRAM. The DDR DRAM achieves increased performance by providing for two data accesses within a single clock cycle —hence its name —by enabling the memory to read data on both the rising and falling edges of each clock cycle. The concept of DDR memories has been extended to SDRAM's and SGRAM's in particular, resulting in DDR SDRAM and DDR SGRAM. Such memory has witnessed increased interest on the part of graphics card designers as a manner by which increased graphics performance can be realized.

A disadvantage to DDR SDRAM/SGRAM's found in the prior art, however, is that full-page burst is not generally provided for. (In general, a burst operation for a memory is defined as an operation retrieving a given number of data stored at sequential locations within the memory (e.g., a full-page of memory), which ultimately allows the data to be retrieved in a faster manner —hence the term "burst.") This is because of a limitation of the prefetch nature of DDR devices. That is, in a DDR device, for a given clock cycle, two words of data, each of n-bits length, are retrieved, such that both must be from the same location within the memory as addressed by the logical circuitry before the next location can be moved to. This is acceptable for a full-page increment burst starting with an even start word address, because the second data word retrieved is still within the same location within the memory as the first data word. However, a full-page increment burst starting with an odd start word address does not work, because the second data word retrieved will necessarily not lie within the same location as the first data word as addressed by the logical circuitry, violating the limitation of the prefetch nature of DDR devices.

There is a need, therefore, for a DDR SDRAM/SGRAM that has burst capability. For these and other reasons, there is a need for the present invention.

SUMMARY OF THE INVENTION

The above-mentioned shortcomings, disadvantages and problems are addressed by the present invention, which will be understood by reading and studying the following specification. The invention relates to a dual-data rate (DDR) synchronous dynamic random access memory (SDRAM)/synchronous graphic random access memory (SGRAM). In one embodiment, the DDR SDRAM/SGRAM includes a memory array and a logic circuitry coupled thereto. The memory array is addressable by even and odd word addresses. The logic circuitry has a burst increment mode to access the array starting at an even word address and a burst decrement mode to access the array starting at an odd word address.

Thus, the invention provides for advantages not found in the prior art. A DDR SDRAM/SGRAM according to the invention is able to have a burst increment mode when starting at an even word address, and a burst decrement mode when starting at an odd word address. Thus, the limitation imposed by the prefetch nature of DDR devices is not violated. When starting at an even word address, the DDR SDRAM/SGRAM counts up (increments) so that the second data word retrieved is still from the same memory location as the first data word as addressed by the logic circuitry, while when starting at an odd word address, the DDR SDRAM/SGRAM counts down (decrements), also so that the second data word retrieved is still from the same memory location as the first data word as addressed by the logic circuitry.

The invention includes DDR SDRAM/SGRAM's, memory devices, graphics subsystems, graphics cards and computers whether formed from component semiconductor chips or embedded on a semiconductor chip. It also includes methods of varying scope. Still other embodiments, advantages and aspects of the invention will be understood by reference to the drawings and by reading the detailed description.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Figure 1:
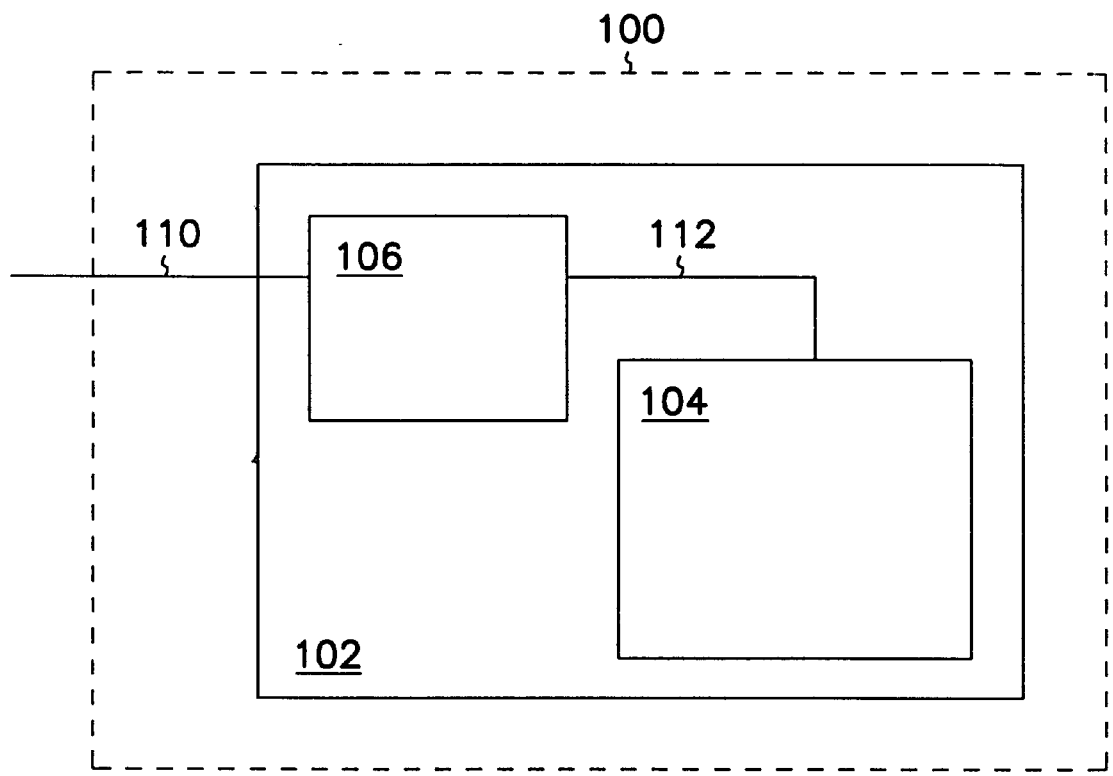
FIG. 1 is a block diagram of a DDR SDRAM/SGRAM, according to one embodiment of the invention.

The invention provides for a dual-data rate (DDR) synchronous dynamic random access memory (SDRAM)/synchronous graphic random access memory (SGRAM) having a full-page increment/decrement burst mode. Referring first to FIG. 1, a block diagram of a dual-mode DDR SDRAM/SGRAM, according to one embodiment of the invention, is shown. DDR SDRAM/SGRAM 100 includes a memory device 102, although the invention is not so limited.

The memory device 102 includes a memory array 104, a logic circuitry 106, lines 110 for external connection to the device 102, and lines 112 coupling the logic circuitry 106 to the array 104. The array 104 includes memory cells addressable by even and odd word addresses, as will be defined. The memory cells are accessed in response to an address signal provided on address lines, not specifically shown in FIG. 1, but which can be part of lines 110 and/or lines 112 in one embodiment. The logic circuitry 106 includes circuitry as can be appreciated by those of ordinary skill within the art, such as input/output buffers, control circuitry, address decoders, etc. In particular, the logic circuitry includes control logic so that a full-page burst mode can be specified: that is, an operation in which all or some of the memory locations in a given row (page), in a given bank, can be accessed sequentially from a given starting address. Lines 110 and 112 in one embodiment can also include lines responsive to controls signals including, but not limited to, a Clock (CLK), a Row Access Strobe (RAS*), a Column Access Strobe (CAS*), a Write Enable (WE*), and a Clock Enable (CKE). The device 102 can also include a register, to which a data word read from the memory array can be output to.

In particular, each memory location within the array 104 contains 2n bits. Each memory location has a unique address which is a combination of a bank address, a row address, and a column address. For read accesses, a given 2n-bit data word is separated into two, n-bit data words at an output mux which follows a read latch (not shown in FIG. 1). The n-bit words are transferred, one at a time, to data I/O (DQ) terminals of the device. The order of transfer is determined by the line CA0. The word selected by a 0 logic level on CA0 is considered the even word (or, alternatively, any address with CA0 =0 is considered an even word address). The word selected by a 1 logic level on CA0 is considered the odd word (or alternatively, any address with CA0=1 is considered an odd word address). For write accesses, two n-bit words are input, one at a time, through the DQ terminals of the device, and are stored in two parallel input registers, the outputs of which are combined to form a single 2n-bit word to be written to a memory location in the array. The order of loading in the registers —even and then odd, or odd and then even —is defined by CA0 =0, or CA0 =1, respectively.

Therefore, the odd and even word addressing described herein applies to the logical circuitry (input registers and output mux), and not necessarily to the memory array. Also therefore, as used herein, the term word address defines the complete address (CA7–CA0), which is a logical address in the array, and not necessarily a physical address —that is, the two words that are selected between via CA0 are not individually selectable within the array.

Figure 2:
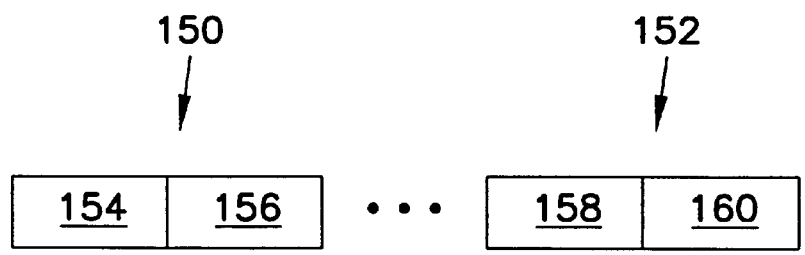
FIG. 2 is a diagram of two 2n-bit memory locations, where each has two data words of n length, amenable to practice of an embodiment of the invention.

The operation of an embodiment of the invention is shown in more detail in FIG. 2, which is a diagram of two 2n-bit memory locations, where each has two data words of n length, amenable to practice of an embodiment of the invention. That is, there are two 2n-bit memory locations 150 and 152. Memory location 150 has two words of n bits, a first word 154 which is defined as addressable by an even word address, and a second word 156 which is defined as addressable by an odd word address. Memory location 152 has two words of n bits also, a first word 158 which is defined as addressable by an even word address, and a second word 160 which is defined as addressable by an odd word address. In one embodiment, n=32 bits, such that each memory location 150 and 152 is 64-bits, and each memory location 150 and 152 has two words of 32-bits.

Thus, if a full-page increment burst operation is specified starting at the memory location in which the first data word 154 lies (such that, for example, the word 154 is retrieved on a rising edge of a clock cycle), then the second word retrieved is the second data word 156 (e.g., on a falling edge of the clock cycle). In this way, the limitation imposed by the prefetch nature of the DDR memory is preserved: both data words 154 and 156 at the same memory location 150 are retrieved prior to movement to the memory location 152. Likewise, if a full-page decrement burst operation is specified at the memory location in which the second data word 160 lies (such that, for example, the word 160 is retrieved on a rising edge of a clock cycle), then the second data word retrieved is the first data word 158 (e.g., on a falling edge of the clock cycle). In this way, the limitation imposed by the prefetch nature of the DDR memory is still preserved: both data words 160 and 158 at the same memory location 152 are retrieved prior to movement to the memory location 150. By providing for a decrement operation for odd word addresses and an increment operation for even word addresses, therefore, embodiments of the invention ensure that there is no violation of the prefetch nature of DDR memories.

Figure 7A:
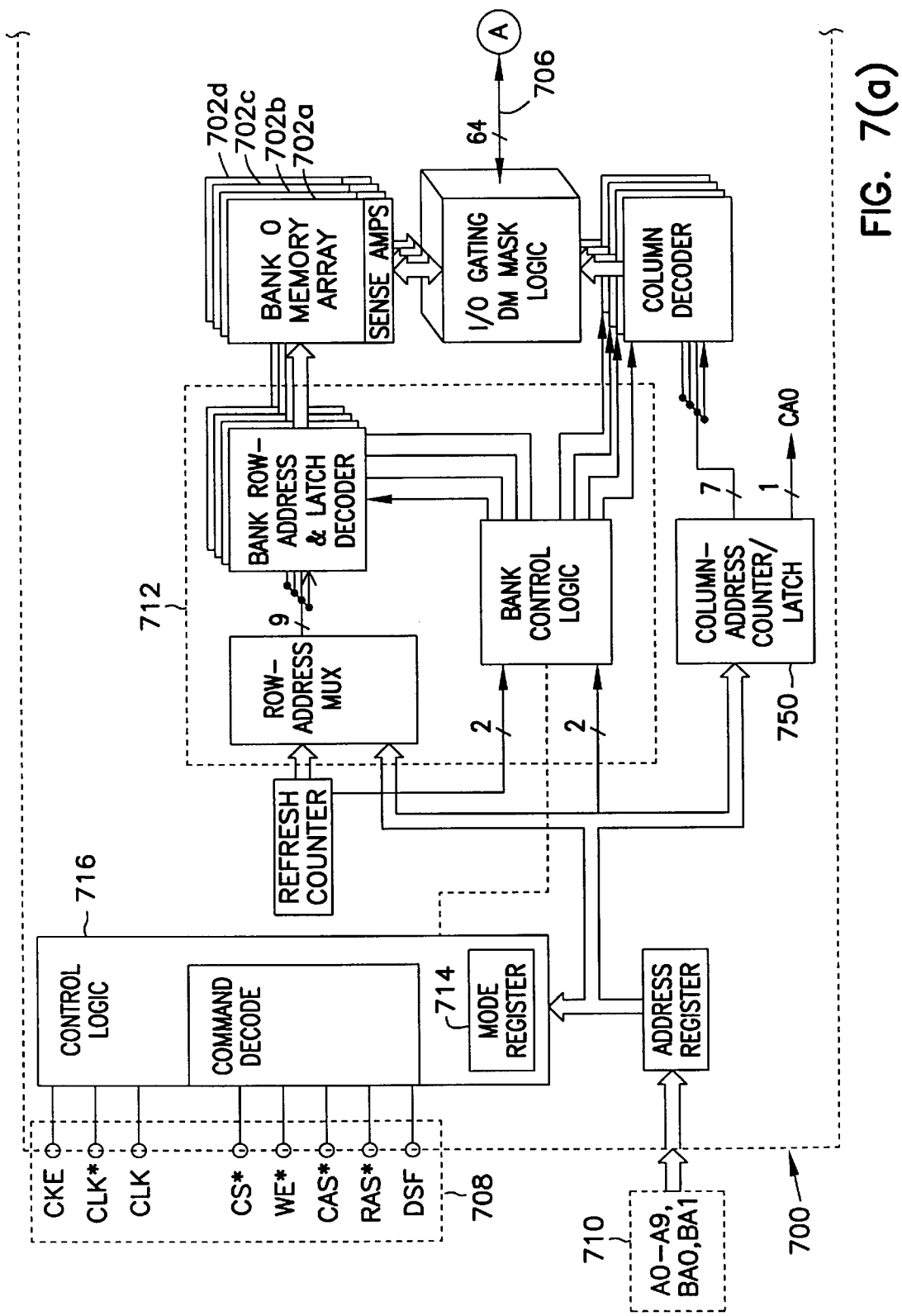
FIG. 7(a) is a diagram showing a first part of a DDR SDRAM/SGRAM according to an embodiment of the invention.
Figure 7B:
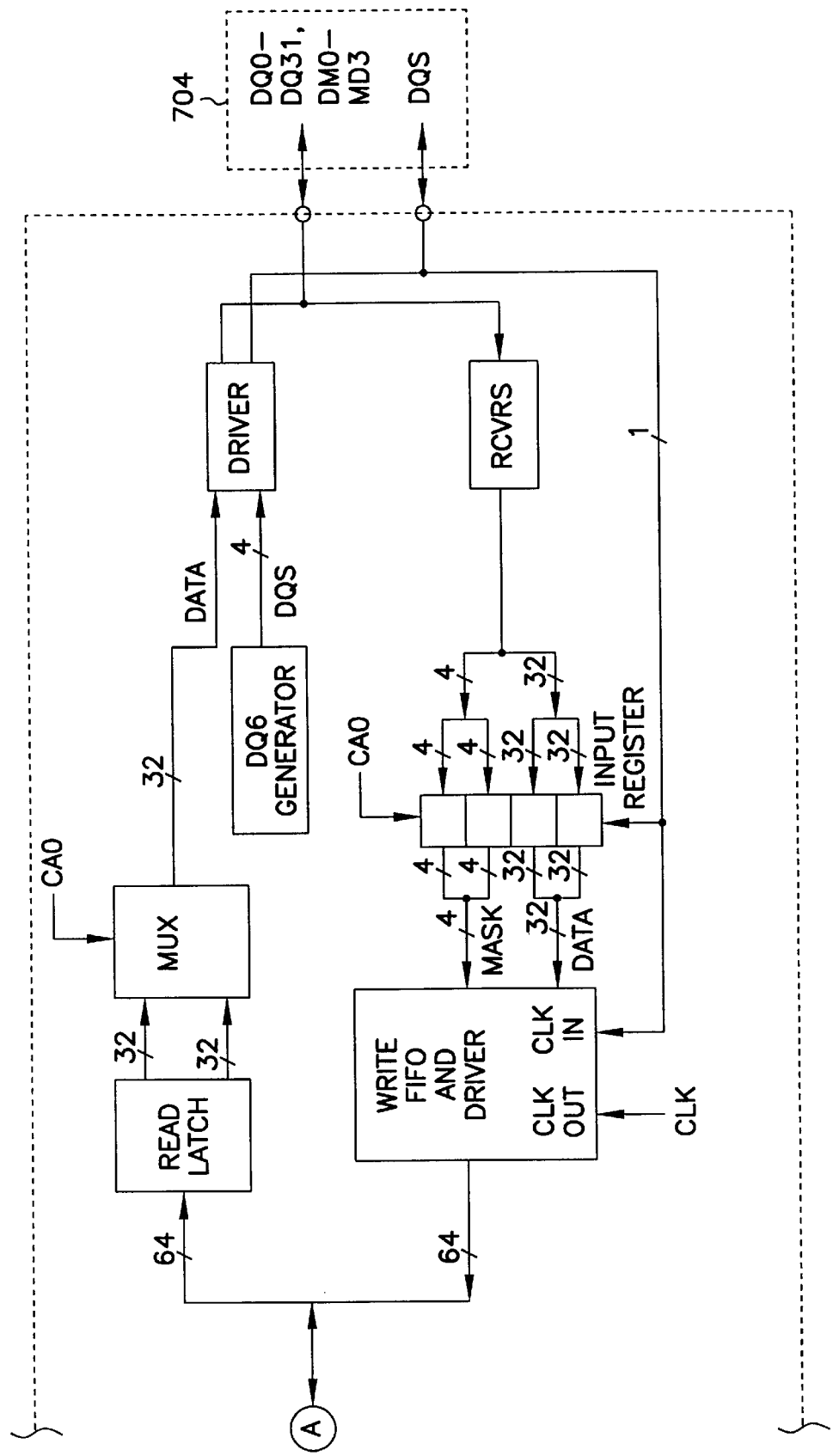
FIG. 7(b) is a diagram showing a second part of a DDR SDRAM/SGRAM according to an embodiment of the invention; and, FIG. 7(c) is a diagram of an address counter/latch shown in more detail, according to an embodiment of the invention.

A more detailed diagram of a DDR SGRAM, according to one embodiment of the invention, is shown in FIGS. 7(a) and 7(b). The DDR SGRAM 300 is a sixteen megabit (Mb), high-speed Complementary Metal Oxide Semiconductor (CMOS), dynamic random-access memory containing 16,777,216 bits. It is internally configured as a quad-bank DRAM, with each 4,194,304-bit bank 702a, 702b, 702c and 702d organized as 512 rows by 256 words by 32 bits.

The DDR SGRAM 700 uses an internal, pipelined DDR architecture to achieve high-speed operation. The DDR architecture is basically a 2n prefetch architecture with an interface to transfer two data words per clock cycle at the input/output (I/O) pins 704. A single read or write access for the SGRAM 700 consists of a single 64-bit, one-clock-cycle data transfer at the internal DRAM core at 706 and two corresponding 32-bit, one-half-clock-cycle data transfer at the I/O pins 304.

A bidirectional data strobe (DQS), part of the I/O pins 704, is transferred externally, along with data, for use in data capture at the receiver. DQS is an intermittent strobe transmitted by the SGRAM 700 during READs and by the memory controller (not shown in FIG. 3(a) nor FIG. 3(b)) during WRITEs. DQS is edge-aligned with data for READs and center-aligned with data for WRITEs.

The SGRAM 700 operates from a differential clock (CLK and CLK#, part of control pins 708; the crossing of CLK going HIGH and CLK# going LOW is referred to as the positive edge of CLK). Commands (address and control signals on control pins 708) are registered at every positive edge of CLK. Input data is registered on both edges of DQS (part of I/O pins 704), and output data is referenced to both edges of DQS as well as both edges of CLK.

Read and write accesses to the DDR SGRAM 700 are burst oriented; accesses start at a selected location and continue for a programmed number of locations in a programmed sequence. Accesses begin with the registration of an ACTIVE command, which is then followed by a READ, WRITE, or BLOCK WRITE command. The address bits registered coincident with the ACTIVE command are used to select the bank and row to be accessed (BA0, BA1 select the bank, A0–A8 select the row, at bank and row pins 710) via bank and row logic circuitry 712. The address bits registered coincident with the READ or WRITE command are used to select the starting word location for the burst access.

The SGRAM 700 provides for programmable READ or WRITE burst lengths of 2, 4, or 8 locations, or the full page. An AUTO PRECHARGE function may be enabled to provide a self-timed row precharge that is initiated at the end of the burst sequence.

As with standard SGRAM's, the SGRAM 700 has a pipelined, multibank architecture providing for concurrent operation, thereby providing high effective bandwidth by hiding row precharge and activation time.

The DDR SGRAM 700 differs from DDR SDRAM's in configuration and by providing 16-column BLOCK WRITE and full-page burst capability. That is, the quad-bank pipelined architecture combined with the additional graphics functions results in a device well suited to high-performance graphics applications or other high-bandwidth applications.

The DDR SGRAM 700 can in one embodiment be designed to operate in 2.5 volt, low-power memory systems. An auto refresh mode can be provided, along with a power-saving, power-down mode. All inputs can be compatible with the Joint Electronic Device Engineering Council (JEDEC) Standard for SSTL_2, as known within the art. All outputs can be SSTL_2, Class II compatible, as also known within the art.

Figure 7C:
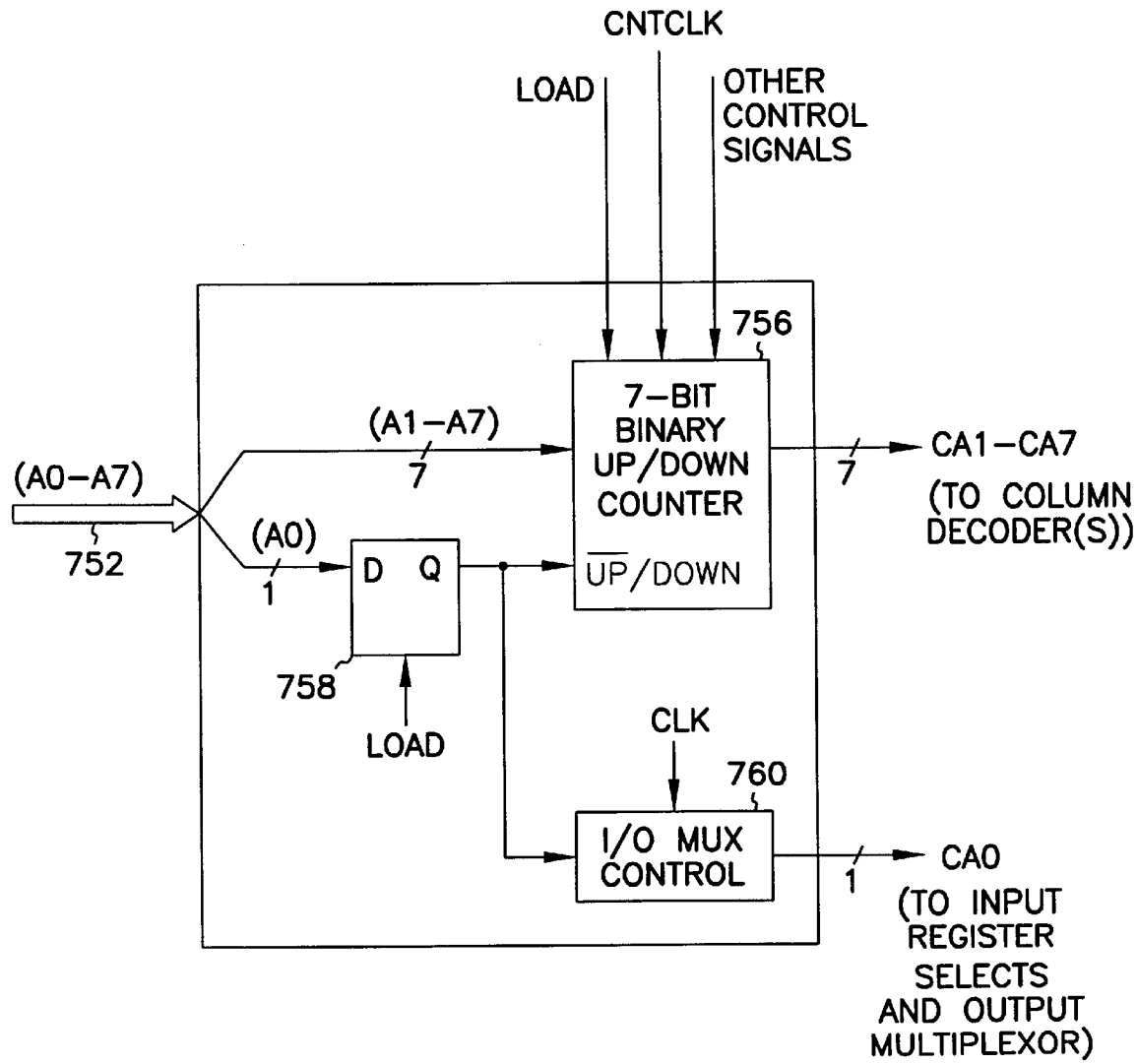

As shown in FIGS. 7(a) and 7(b), the DDR SGRAM 700 includes an address counter/latch 750. This counter/latch 750 is shown in more detail in FIG. 7(c), which is now referred to. When a read or write command is applied, the address information provided externally on lines 752, along with the read or write command is captured (under the control of the LOAD signal 754) in the counter/latch 750. A0 is captured in the 1-bit latch 758, A1–A7 in the 7-bit counter 756. A0 is held in the latch 758 for the entire burst. A0 is further fed to the counter 756 to control whether the counter counts up (increments) or down (decrements). A0 is also fed to the I/O mux control circuit 760, which in turn provides the control signals for the input register selects and output mux. If A0 is 0, CA0 will look like 010101 . . . ; if A0 is 1, CA0 will look like 101010. . . —that is, a version of CLK, or an inverted version of CLK. Note that this signal changes every ½ clock period (that is, at a 2×clock rate, which is part of the nature of DDR devices).

The 7-bit counter 756 outputs CA1–CA7 change once per CNTCLK cycle; CNTCLK has the same frequency as the main CLK signal for the device, so inputs to the column decoder(s) change at a 1× clock rate. Other control signals, as those of ordinary skill within the art can appreciate, are provided to control other burst lengths and sequences.

Figure 3:
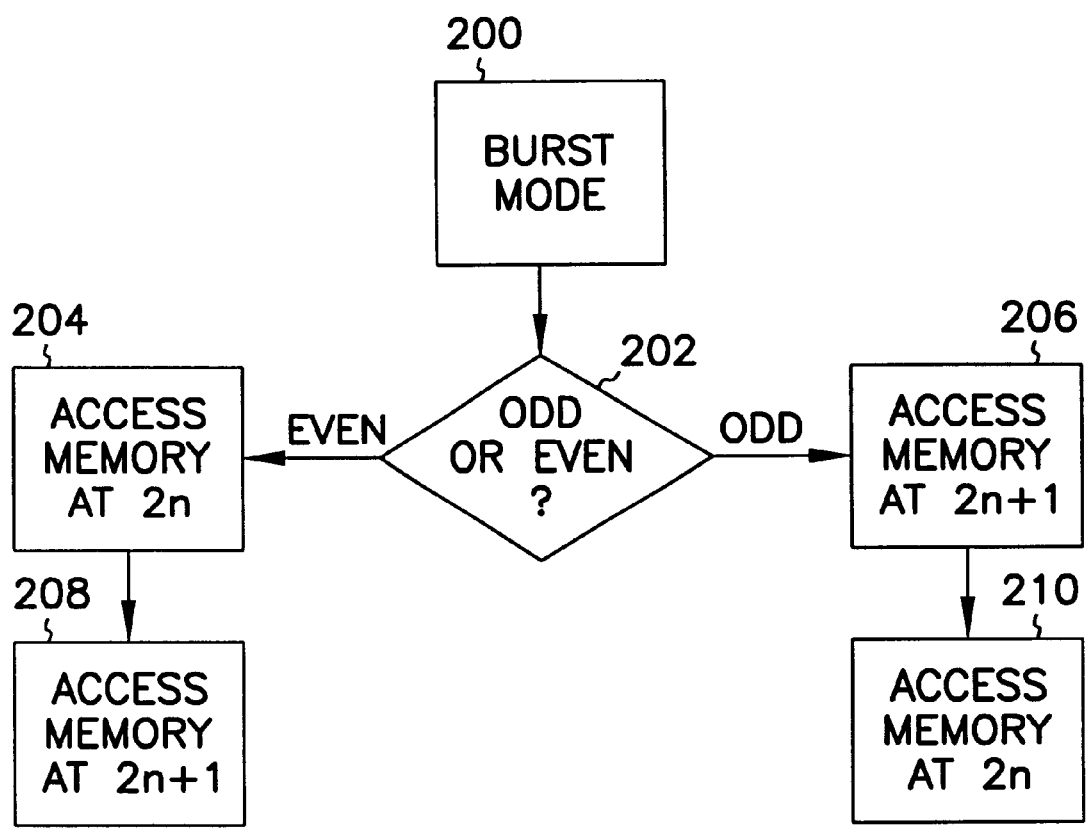
FIG. 3 is a flowchart of a method according to an embodiment of the invention.

Referring next to FIG. 3, a flowchart of a method according to an embodiment of the invention is shown. The method of FIG. 3 may be performed by a DDR SDRAM/SGRAM according to the invention, such as the DDR SDRAM/SGRAM as has been described in conjunction with FIG. 1 and FIG. 2. In 200, a burst mode, such as a full-page burst mode is specified. In 202, it is determined whether a specified starting word address is even or odd; if even, then the method proceeds to 204, such that the operation of the memory is switched to an increment burst mode, whereas if odd, then the method proceeds to 206, such that the operation of the memory is switched to a decrement burst mode.

In the increment burst mode, in 204, the memory is accessed at an even word address that can be written as $2a$, on a rising edge of a clock cycle. In one embodiment, this entails retrieving the 2n-bit word at memory location $2a$, and outputting the first n-bit word, $2a$, through an output mux to coincide with a rising edge of the clock cycle, and then outputting the second n-bit word, $2a+1$, to coincide with the falling edge of the clock cycle in 208.

In the decrement burst mode, in 206, the memory is accessed at an odd word address that can be written as $2a+1$, on a rising edge of a clock cycle. In one embodiment, this entails retrieving the 2n-bit word at memory location $2a$, and outputting the second n-bit word, $2a+1$, through the output mux to coincide with a rising edge of the clock cycle, and then outputting the first n-bit word, $2a$, to coincide with the falling edge of the clock cycle in 210.

Figure 4:
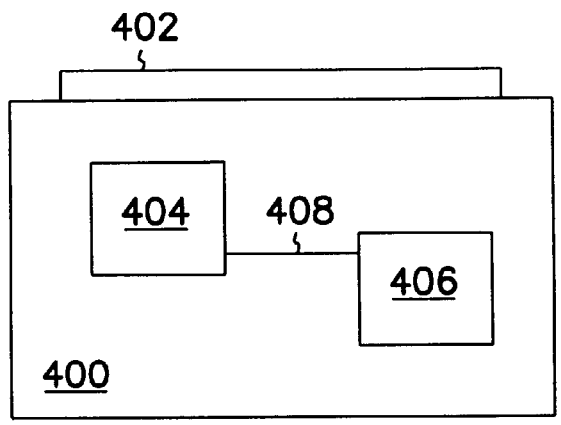
FIG. 4 is a diagram of a graphics subsystem or graphics card according to an embodiment of the invention.

A DDR SDRAM/SGRAM in accordance with the invention may be utilized in different devices, such as a graphics (or, video) card (or, controller), and a graphics subsystem of a computer. Referring to FIG. 4, a diagram of a graphics subsystem or graphics card according to an embodiment of the invention is shown. The graphics card 400 includes an edge connector 402, a graphics processor 404, a dual-mode DDR SDRAM/SGRAM 406, and lines 408 connecting the processor 404 to the DDR SDRAM/SGRAM 406. The edge connector 402 is not limited by the invention, and is meant to plug the card 400 into a corresponding slot of a computer of a computer, as can be appreciate by those of ordinary skill within the art. Thus, the connector 402 may be in accordance with different connector-slot standards, such as the Advanced Graphics Port (AGP), Peripheral Component Interconnect (PCI), Industry Standard Architecture (ISA), etc.

Similarly, the processor 404 is also not limited by the invention. The processor 404 provides for the display of graphics on a computer display, in response to receiving data and commands from the computer or graphics subsystem into which the card is connected and/or is a part, via the connector 402. The processor 404 utilizes the DDR SDRAM/SGRAM 406 in this regard, to, for example, store a complete frame of a video image (the DDR SDRAM/SGRAM 406 hence acting as a frame buffer).

Further, the separation of the diagram into separate boxes 404 and 406 is not intended to limit how the circuitry and functions performed therein are separated. For example, both the processor 404 and the DDR SDRAM/SGRAM 406 may alternatively be embedded on a semiconductor chip which may be a mounted on a computer motherboard. Of course, even that separation may not be limiting since the graphics subsystem 400 and other components of the computer system may be located on a chip.

Figure 5:
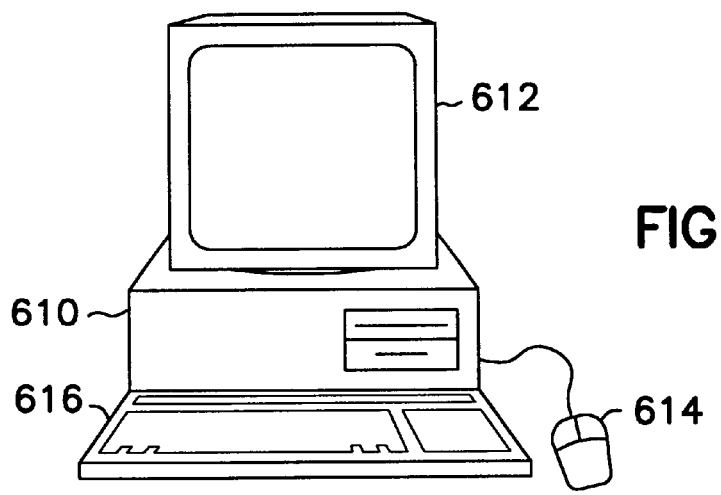
FIG. 5 is a diagram of a computer in conjunction with which embodiments of the invention may be implemented.

Referring now to FIG. 5, a diagram of a computer in conjunction with which embodiments of the invention may be implemented is shown. Computer 610 is operatively coupled to display device 612, pointing device 614, and keyboard 616. Computer 610 includes a processor, random-access memory (RAM), read-only memory (ROM), and one or more storage devices, such as a hard disk drive, a floppy disk drive (into which a floppy disk can be inserted), an compact-disc read-only-memory (CD-ROM) player (into which a CD-ROM can be inserted), and a tape cartridge drive. The memory, hard drives, floppy disks, etc., are types of computer-readable media. Computer programs running on the computer are executed by the processor from the computer-readable media. The invention is not particularly limited to any type of computer 610.

Display device 612 permits the display of information for viewing by a user of the computer. The invention is not limited to any particular display device 612. Such display devices include cathode ray tube (CRT) displays (monitors), as well as flat panel displays such as liquid crystal displays (LCD's). The display device 612 is controlled by a graphics subsystem of the computer 610 (not shown in FIG. 6) coupled to the computer, such that the subsystem displays graphical information on the device 612. The graphics subsystem includes a DDR SDRAM/SGRAM according to the invention, such as that of FIG. 1.

Pointing device 614 permits the control of a screen pointer provided by graphical user interfaces that may run on the computer. The invention is not limited to any particular pointing device 614. Such pointing devices include mouses, touch pads, trackballs, remote controls and point sticks. Finally, keyboard 616 permits entry of textual information into computer 610, as known within the art, and the invention is not limited to any particular type of keyboard.

Figure 6:
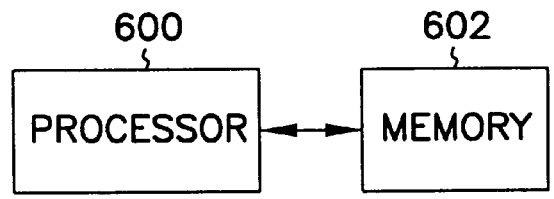
FIG. 6 is a diagram of another system according to an embodiment of the invention.

Referring finally to FIG. 6, a diagram of a system in accordance with one embodiment of the invention is shown. The system includes a processor 600, and a memory 602. The processor 600 is also not limited by the invention. The processor 600 utilizes the memory 602. The memory 602 is in accordance with an embodiment of the invention, and in one embodiment may be the DDR SDRAM/SGRAM of FIG. 1.

In another embodiment, the processor 600 and memory 602 may be on a single chip. In that embodiment, the memory 602 is in accordance with an embodiment of the invention, and may be the DDR SDRAM/SGRAM of FIG. 1.

The invention is not limited to the function or intended purpose of the system of FIG. 6. As has been described in this application, one such purpose is for graphics processing in the context of a computer. Other functions of the system include a set-top box for a television set, as well as a high-definition television (HDTV) set. The invention is not so particularly. In systems intended for these purposes, as well as systems intended for other purposes, the system may include other components besides the processor 600 and the memory 602. The other such components vary with the application, as known in the art, and as can be appreciated by those of ordinary skill within the art.

A DDR SDRAM/SGRAM has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the following claims and equivalents thereof.

Those skilled in the art will readily appreciate the wide applicability of the present invention. By way of example, and not by way of limitation, the processor 600 and memory 602 of FIG. 6 are on a single chip, and the memory is the DDR SDRAM/SGRAM of the present invention. In other applications, the memory of the present invention is embedded in a wide variety of integrated circuits such as graphics controllers, which also may be embedded in larger circuits such as single chip computer integrated circuits. Embedding the present memory invention is an intended application of this technology and those skilled in the art will recognize that other embedding options exist without departing from the scope of the claimed invention. Further, the present invention may be practiced with compatibility with other features found in memory devices.

I claim:

1. A semiconductor chip containing a dual-data rate (DDR) synchronous dynamic random access memory (DRAM)/synchronous graphic random access memory (SGRAM), the chip comprising:

a memory array addressable by even and odd word addresses; and, a logic circuitry coupled to the memory array having an increment burst mode to access the array starting at an even word address and a decrement burst mode to access the array starting at an odd word address.

2. A semiconductor chip having dual-data rate (DDR) memory, the chip comprising:

a memory array;

a logic circuitry coupled to the memory array having an increment burst mode and a decrement burst mode.

3. The chip of claim 2, wherein the memory array is addressable by odd and even word addresses, the increment burst mode to access the memory array starting at one of an odd and an even word address and the decrement burst mode to access the memory array starting at an other of an odd and an even word address.

4. The chip of claim 3, wherein the logic circuitry accesses the memory starting at an odd word address in the increment burst mode and accesses the memory starting at an even address in the decrement burst mode.

5. The chip of claim 2, wherein the DDR memory comprises a synchronous dynamic random access memory (SDRAM)/synchronous dynamic graphic random access memory (SGRAM).

6. A dual-data rate (DDR) memory chip comprising:

a memory array formed on the chip and addressable by even and odd word addresses; and, logic circuitry formed on the chip and coupled to the memory array having a first burst mode to access the array starting at an odd word address and a second burst mode to access the array starting at an even word address.

7. The memory chip of claim 6, wherein the first burst mode comprises an increment burst mode, and the second burst mode comprises a decrement burst mode.

8. The memory chip of claim 6, wherein the DDR memory comprises a synchronous dynamic random access memory (SDRAM)/synchronous dynamic graphic random access memory (SGRAM).

9. A graphics subsystem formed on a semiconductor chip, comprising:

a processor; and, a dual-data rate (DDR) synchronous dynamic random access memory (SDRAM)/synchronous graphic random access memory (SGRAM) having an increment mode and a decrement mode.

10. The graphics subsystem chip of claim 9, wherein the increment mode comprises an increment burst mode and the decrement mode comprises a decrement burst mode.

11. The graphics subsystem chip of claim 9, wherein the DDR SDRAM/SGRAM includes a memory array addressable by even and odd word addresses, the increment burst mode accessing the memory starting at an even word address and the decrement burst mode accessing the memory starting at an odd word address.

12. A graphics subsystem chip comprising:

a processor formed on a semiconductor chip; and, a dual-data rate (DDR) synchronous dynamic random access memory (SDRAM)/synchronous graphic random access memory (SGRAM) formed on the chip and having a first burst mode to access a memory array starting at an odd word address and a second burst mode to access the array starting at an even word address.

13. The graphics subsystem chip of claim 12, wherein the first burst mode comprises an increment burst mode, and the second burst mode comprises a decrement burst mode.

14. A computer comprising a semiconductor chip having formed on it computer circuitry portions, comprising:

a processor;

a memory coupled to the processor; and, a graphics subsystem coupled to the process and comprising a a dual-data rate (DDR) synchronous dynamic random access memory (SDRAM)/synchronous graphic random access memory (SGRAM) having an increment burst mode and a decrement burst mode.

15. The computer of claim 14, wherein the DDR SDRAM/SGRAM includes a memory array addressable by even and odd word addresses, the increment burst mode accessing the memory starting at an even word address and the decrement burst mode accessing the memory starting at an odd word address.

16. A computer embedded on a semiconductor chip, comprising:

a processor formed on the chip;

a memory formed on the chip and coupled to the processor; and, a graphics subsystem formed on the chip and coupled to the processor and comprising a dual-data rate (DDR) synchronous dynamic random access memory (SDRAM)/synchronous graphic random access memory (SGRAM) having a first burst mode to access a memory array starting at an odd word address and a second burst mode to access the array starting at an even word address.

17. A system embedded on a semiconductor chip, comprising:

a processor; and, a dual-data rate (DDR) memory having an increment burst mode and a decrement burst mode.

18. The system embedded on the chip of claim 17, wherein the DDR memory comprises a synchronous dynamic random access memory (SDRAM)/synchronous dynamic graphic random access memory (SGRAM).

* * * * *